United States Patent [19]

Landmann

[11] Patent Number: 5,053,769
[45] Date of Patent: Oct. 1, 1991

[54] FAST RESPONSE DIGITAL INTERFACE APPARATUS AND METHOD

[75] Inventor: Wolf S. Landmann, Fair Lawn, N.J.

[73] Assignee: Borg-Warner Automotive, Inc., Sterling Heights, Mich.

[21] Appl. No.: 478,287

[22] Filed: Feb. 12, 1990

[51] Int. Cl.$^5$ ............................................. H03M 5/8
[52] U.S. Cl. ........................................ 341/53; 341/52
[58] Field of Search ............... 341/51, 52, 53, 144, 341/145, 152; 307/265, 268; 377/42, 47, 48, 111

[56] References Cited

U.S. PATENT DOCUMENTS

| | | |
|---|---|---|
| 3,551,649 | 12/1970 | Weber . |
| 3,742,487 | 6/1973 | Tripp . |
| 3,745,475 | 7/1973 | Turner . |
| 3,747,083 | 7/1973 | Coia . |
| 4,016,558 | 4/1977 | Bishop et al. . |
| 4,053,849 | 10/1977 | Bower et al. . |
| 4,136,335 | 1/1979 | Tompsett . |
| 4,150,573 | 4/1979 | Iinuma et al. . |
| 4,201,911 | 5/1980 | Dering . |
| 4,349,746 | 9/1982 | Grossner et al. . |
| 4,389,637 | 6/1983 | Rzeszewski . |
| 4,503,922 | 3/1985 | Brosh et al. . |
| 4,583,856 | 4/1986 | Moore . |
| 4,637,265 | 1/1987 | Fiori, Jr. . |
| 4,644,570 | 2/1987 | Brosh et al. . |
| 4,663,589 | 5/1987 | Fiori, Jr. . |
| 4,709,224 | 11/1987 | Fiori, Jr. . |
| 4,777,436 | 10/1988 | Fiori, Jr. . |
| 4,804,960 | 2/1989 | Fernandes et al. . |
| 4,807,264 | 2/1989 | Bauer . |
| 4,816,704 | 3/1989 | Fiori, Jr. . |
| 4,833,919 | 5/1989 | Saito et al. . |
| 4,837,573 | 6/1989 | Brooks .............................. 341/152 |
| 4,841,245 | 6/1989 | Fiori, Jr. . |
| 4,851,770 | 7/1989 | Fiori, Jr. . |
| 4,940,979 | 7/1990 | Bohley et al. ...................... 341/152 |

OTHER PUBLICATIONS

"A 16-Bit A-D-A Conversion System for High-Fidelity Audio Research", *IEEE Transactions on Acoustics, Speech, and Signal Processing*, vol. ASSP-23, No. 1, Feb. 1975.

*Primary Examiner*—A. D. Pellinen
*Assistant Examiner*—Brian K. Young
*Attorney, Agent, or Firm*—Harness, Dickey, et al.

[57] ABSTRACT

The digital interface divides a digital number ($N_o$) representing the sensor reading into a most significant part (MSB) and a least significant part (LSB). The most significant part is used to determine the pulse width of a sequence of pulses and the least significant part is used to selectively modify the pulses by increasing the pulse width of selected ones of the pulses. A lookup table (54) is used to evenly distribute the lengthened pulses throughout the pulse train. The resulting waveform has a DC component representative of the original digital number which is extracted by low pass filtering. The energy in the non-DC spectral components is appreciably attenuated as compared to the spectrum of a standard pulse width modulated waveform. This makes it possible to use a filter (28) with considerably higher cutoff frequency and with considerably improved response time for a given resolution.

16 Claims, 9 Drawing Sheets

FAST RESPONSE DIGITAL INTERFACE APPARATUS AND METHOD

BACKGROUND AND SUMMARY OF THE INVENTION

The present invention relates generally to digital signal processing and signal conversion techniques. More particularly, the invention relates to a digital interface apparatus capable of providing high resolution and fast response time and suitable for interfacing sensors to systems requiring analog information. Although the invention is applicable to a wide variety of different types of sensors, it will be explained in the context of a noncontact displacement sensor.

One noncontact technique for sensing displacement or change in displacement involves using a resonant tank circuit in which an element of the tank circuit changes impedance in response to physical movement. The change in impedance results in a change in the resonant frequency of the tank circuit and that change in resonant frequency can be measured and related to the physical movement.

In a typical sensor embodiment is a rotary position sensor consisting of a pair of planar spiral coils placed on a stationary board with a pair of semicircular moving members located in a parallel plane above and below the coils. The moving members are mounted on a shaft extending between the two coils and perpendicular to the plane of the coils. See, for example, U.S. Pat. No. 4,644,570 which issued to Brosh and Landmann, entitled "Sensor Amplification and Enhancement Apparatus Using Digital Techniques." The position of the moving members varies the inductance of the coils in a complementary fashion. When the plate is rotated by the shaft in one direction, the inductance of one coil increases and the inductance of the other coil decreases in a related way. The coils are alternately connected to a capacitor and energized by an oscillator to establish a resonant tank circuit. The position of the tuning plate changes the coil inductance and thereby changes the resonant frequency. By measuring the resonant frequency when the tank circuit is in oscillation, the position of the tuning plate can be inferred.

By using dual complementary coils, and by multiplexing so that the two coils share the same tank circuit capacitor, many temperature effects and component drift errors are compensated for. The coils are alternately energized and de-energized, rather than simultaneously energized, to prevent electromagnetic cross-coupling interference between the two coils.

In the conventional arrangement described above, the respective coil resonant frequencies can be measured and a digital number or numbers representative of the resonant frequency obtained. The digital numbers obtained are then used as the basis for computing an integer which is used to modulate the duty cycle of a fixed frequency pulse train using the system clock. The duty cycle so modulated is thus indicative of resonant frequency and ultimately indicative position of the moving members. For example, in a digital system having 8 bits of resolution (256 possible numeric values) the number 128 is expressed as a 50% duty cycle. It will provide a pulse which is ON for 128 and OFF for 128 of the 256 clock pulse repetition rate. By comparison, the number 129 is expressed as a pulse of duty cycle slightly less than 50.4%, i.e., ON for 129 clock pulses and OFF for 127 clock pulses.

By integrating or averaging the variable duty cycle pulse train using a low pass filter, the variable duty cycle information is converted into an analog voltage. In this fashion the sensor provides an analog signal with voltage level indicating the tuning plate position.

The above duty cycle modulation approach has a serious limitation in applications requiring both high resolution and fast response time. For a system with a fixed main system clock rate, increasing the resolution causes the frequency of the variable duty cycle pulse train to be reduced because of the longer counts. In practice, the main system clock rate is fixed due to limited physical constraints of electronic circuitry. For example, present day CMOS devices in popular use constrain the clock rate to approximately 10 megahertz. Faster devices are anticipated, but clock rate will still be a limiting factor.

The base clock rate, in effect, dictates the frequency of the variable duty cycle pulse train. At a given base clock rate it takes twice as long to convey a pulse train with a repetition rate of 512 clock cycles as it does to convey a pulse train with a repetition rate of 256 clock cycles. Thus in improving resolution from an 8 bit system (256 states) to a 10 bit system (1,024 states) the pulse train must increase in period (or decrease in frequency) by a factor of 4. An increase in resolution from 8 bits to 12 bits would similarly result in a change by a factor of 16.

This imposed decrease in pulse train frequency (increase in period) has an impact upon the low pass filter used to integrate the pulse train and produce the analog voltage level. In order to filter out the significantly lower frequency cycle rate of the pulse train, the low pass filter must employ much longer time constants and hence have a much slower response time.

Resolution and response time thus are inversely proportional. Improving resolution degrades response time and vice versa. This has practical implications in using and designing sensors. For example, a foot pedal position sensor in a drive by wire automotive system may require both high resolution and fast response time. Present noncontact sensor technology is generally inadequate to meet such requirements.

The present invention overcomes the above dichotomy between resolution and response time exhibited by conventional sensor interface technology. The invention is able to simultaneously provide both high resolution and fast response time. The invention provides a digital interface which implements a modulated sequence or width-modulated duty cycle pulse train. The derived integer number indicative of the sensor position to be represented as a variable duty cycle pulse train is divided into a most significant part and a least significant part. The most significant part is converted into a sequence of a predetermined number of pulses in which the duty cycle of each pulse represents a value which corresponds to the most significant part and the repetition rate is that of the most significant part. The least significant part is used to selectively alter the width of selected ones of the pulses. The sequence of pulses, so altered, may be integrated over the sequence or averaged to extract an analog output indicative of the original integer number. The invention may also be used to represent rational numbers by operating on numerator and denominator separately in this fashion.

The apparatus and method of the invention permits high resolution data to be conveyed using a much higher frequency pulse train than is possible with the same clock rate using the conventional duty cycle modulation approach. The invention may be used as an interface for a sensor, resulting in a high resolution, fast-acting sensor not heretofore available. The invention may be implemented in hardware or software and is well suited to a microelectronic fabrication in which the entire circuit is masked onto a chip using ASIC techniques and employing SOT techniques for surface mounting directly to the sensor package.

For a more complete understanding of the invention, its objects and advantages, reference may be had to the following specification and to the accompanying drawings.

BRIEF DESCRIPTION OF THE DRAWINGS

FIG. 3 is a block diagram of the pulse generator circuit of the invention;

FIG. 6 is a timing diagram showing the time relationships among various signals over the time interval T—T of FIG. 5;

FIGS. 7 and 8 are timing diagrams showing the time relationships among various signals during the time interval U—U of FIG. 5, FIG. 7 showing the case when control signal CTRL−P=0 and FIG. 8 for the case where control signal CTRL−P=1;

DESCRIPTION OF THE PREFERRED EMBODIMENT

Figure 1:
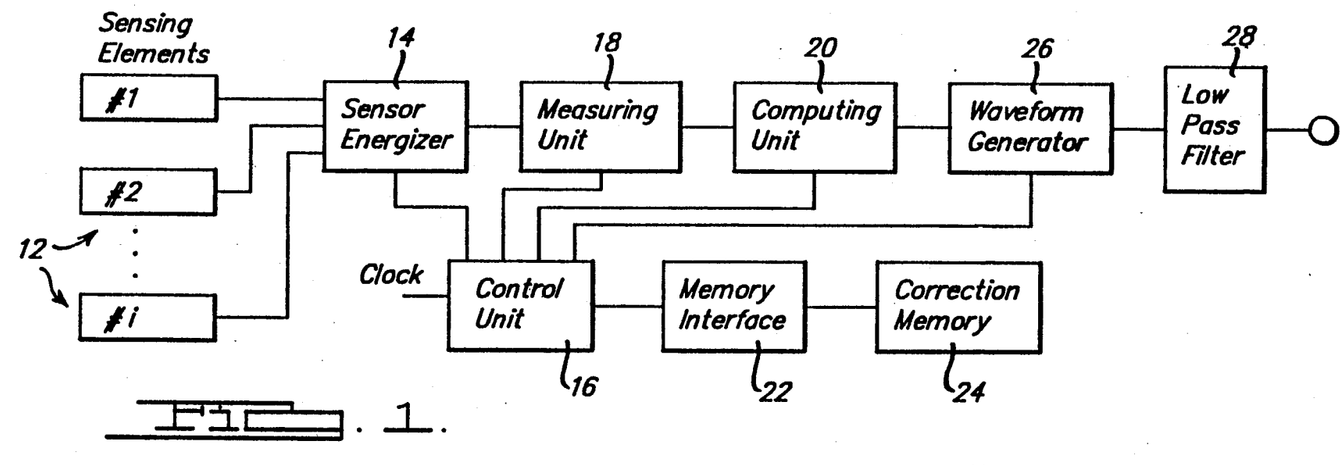
FIG. 1 is a system block diagram useful in explaining the invention.

Referring to FIG. 1, the invention is illustrated in an exemplary application as a noncontact sensor interface. For illustration purposes the noncontact sensing elements have been designated diagrammatically at 12. These sensing elements may be, for example, planar sensor coils of the configuration described in U.S. Pat. No. 4,644,570, entitled "Sensor Amplification and Enhancement Apparatus Using Digital Techniques." The sensing elements are selectively energized and thereby caused to oscillate at the resonant frequency by sensor energizer circuit 14. The sensor energizer circuit, as well as other circuit elements in FIG. 1, are controlled by control unit 16. The control unit 16 causes the sensor energizer to sequentially energize the sensing elements 12. The sensing elements are energized separately to prevent crosstalk among the sensors. As each sensor is energized, the resonant frequency of that sensor is measured and stored in measuring unit 18. The stored frequency data is then transferred to computing unit 20 which converts the measured frequency into a digital number and which performs any desired digital processing of that number. For example, the computing unit may select digital frequency information attained from complementary pairs of sensing elements and multiply them by correction factors. Appropriate correction factors can be supplied by control unit 16, which is in turn coupled to a suitable memory interface 22 and correction memory device 24 where the correction factors are stored.

The computing unit may also compute the sum and difference of the corrected digital numbers and thereby compute a rational number or ratio of difference divided by sum. If desired, an additional correction factor can be multiplied by the ratio in order to scale the resulting rational number to correlate the largest attainable difference to the largest digital number representable by the number of bits of resolution. In other words, a "full scale" difference between pairs of sensing elements is scaled to correspond to the largest digital number that can be represented. For example, in a 10 bit system the ratio may be scaled to a digital number which varies from 0 to 1023 counts.

The output of computing unit 20 is supplied to the waveform generator 26 of the invention where the digital number is converted to a pulse train as will be described more fully below. According to the invention, the above digital number, which may be an integer number or a ratio of integer numbers, is represented using a unique modulated sequence pulse width control technique. The pulse train output of waveform generator 26 is fed to low pass filter 28 where the DC component of the pulse train is extracted. This DC component represents an analog voltage level which corresponds directly to the digital number produced by computing unit 20 and thereby gives an indication of the condition (e.g., position) being sensed by the sensing elements 12. By virtue of the digital processing performed by computing unit 20, the analog voltage level, representing sensor output, can be scaled and fit to any linear or nonlinear transducer characteristic by an appropriate transform.

Figure 2:
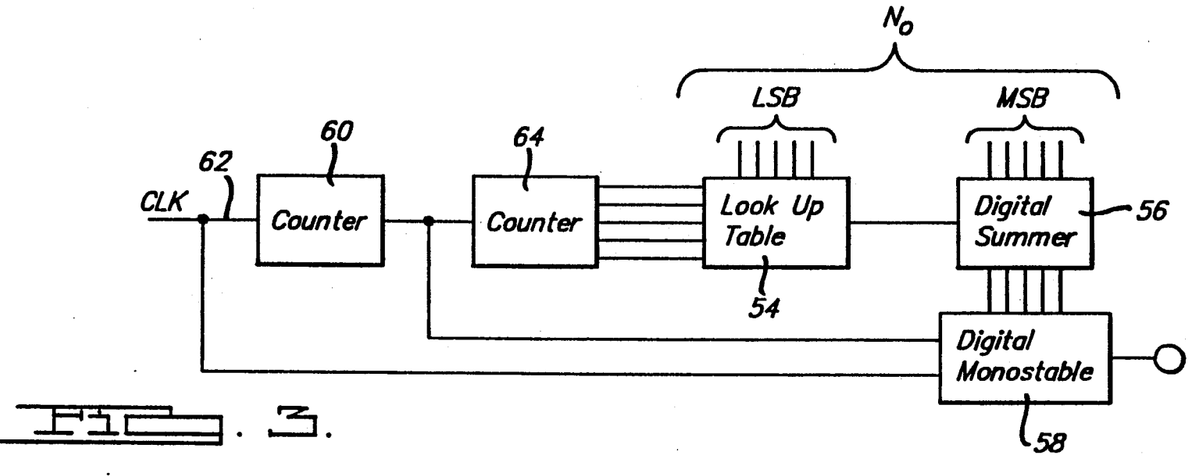
FIG. 2 is a block diagram of the measuring unit and associated interface circuitry of the system of FIG. 1.

Referring to FIG. 2, the sensor energizer and measuring units are shown in more detail. The sensing elements 12 are shown as inductive elements 30 which respond to moving members 32. The sensor energizer element 14 consists of a number of selecting devices 34, which may be tristate buffers. The selecting devices respond to signals on the select lines 36 used by the control unit 16 to selectively address and activate the associated sensing element. The inductive elements 30 are coupled to capacitor 38 and to the energy supplying oscillator circuit 40. When a given inductive element is selected, the inductive element and capacitor 38 form a resonant tank circuit which is energized and set into oscillation by the oscillator 40. The oscillator 40 is controlled by the control unit 16 over control lead 42.

The measuring unit 18 comprises an accumulator 44 which is enabled by digital monostable 46. Digital monostable 46 receives the system clock on lead 48 and is triggered by the control unit on trigger lead 50. When triggered by the control unit, the digital monostable enables oscillator 40 for a fixed period of time for each sensor coil. While the oscillator is enabled, the oscillations of each one of the selected inductive element are fed to the accumulator 44 as data pulses. The number of pulses accumulated for each sensor coil during the fixed time period constitutes a digital number representing the rate of oscillation resonant frequency of the coil capacitor tank. After the fixed time period has elapsed, the data stored in accumulator 44 is latched into a selected one of the latches 52. Latches 52 are selectively enabled by the control unit. A latch 52 is provided for each of the individual sensing elements. In that way, the control unit can selectively energize, measure and store the resonant frequency of each sensing element. Many implementations may use complementary pairs of sensors. In the simplest case a single complementary pair of sensors may be employed. In this case, two latches 52 would normally be used.

FIG. 3 depicts in simplified block diagram format the modulated sequence waveform generator of the invention. For purposes of explanation only, the circuit of FIG. 3 illustrates a 10 bit (1024 state) implementation. Of course, other resolutions are also possible. The incoming signal, comprising a 10 bit digital number from computing unit 20, is divided into a 5 bit most significant part (MSP) and a 5 bit least significant part (LSP). The least significant part is applied to a lookup table 54 and the most significant part is applied to a digital summing circuit 56 along with the output from lookup table 54. The output of summing circuit 56 is applied to a digital monostable 58 which produces output pulses.

Counter 60 divides the system clock on lead 62 by a number corresponding to the number of bits of the most significant part of the digital number $N_O$ from computing unit 20. The terminal count of counter 60 triggers monostable 58. As a result, the output pulses generated by monostable 58 have a pulse repetition rate equal to the number by which counter 60 divided the clock and a width determined by the digital summing circuit 56. For example, if counter 60 divides the system clock by 32 (which corresponds to the division of a 10 bit number $N_O$ into equal 5 bit most significant and least significant parts) the monostable 58 will have a pulse repetition rate of 32 system clock periods.

The output pulses of monostable 58 are grouped in sequences of 32 (assuming $N_O$ is a 10 bit number being divided into equal 5 bit most and least significant parts). The sequence of 32 output pulses is counted by counter 64. Within the 32 pulse sequence, lookup table 54 generates a corresponding sequence of 1 or 0, determined by the least significant part of the number $N_O$ from computing unit 20. The output of lookup table 54 is summed with the most significant part in digital summer 56. As a result, the sequence of 32 output pulses will have a pulse width principally determined by the most significant part, with selected pulses being widened by 1 system clock period as determined by the output of lookup table 54.

Lookup table 54 is preprogrammed to distribute the widened pulses evenly across the 32 pulse sequence. As discussed more fully below, distributing the widened pulses provides an output pulse train with fewer spectral components above the DC level than would be produced were the widened pulses not evenly distributed.

Figure 4:
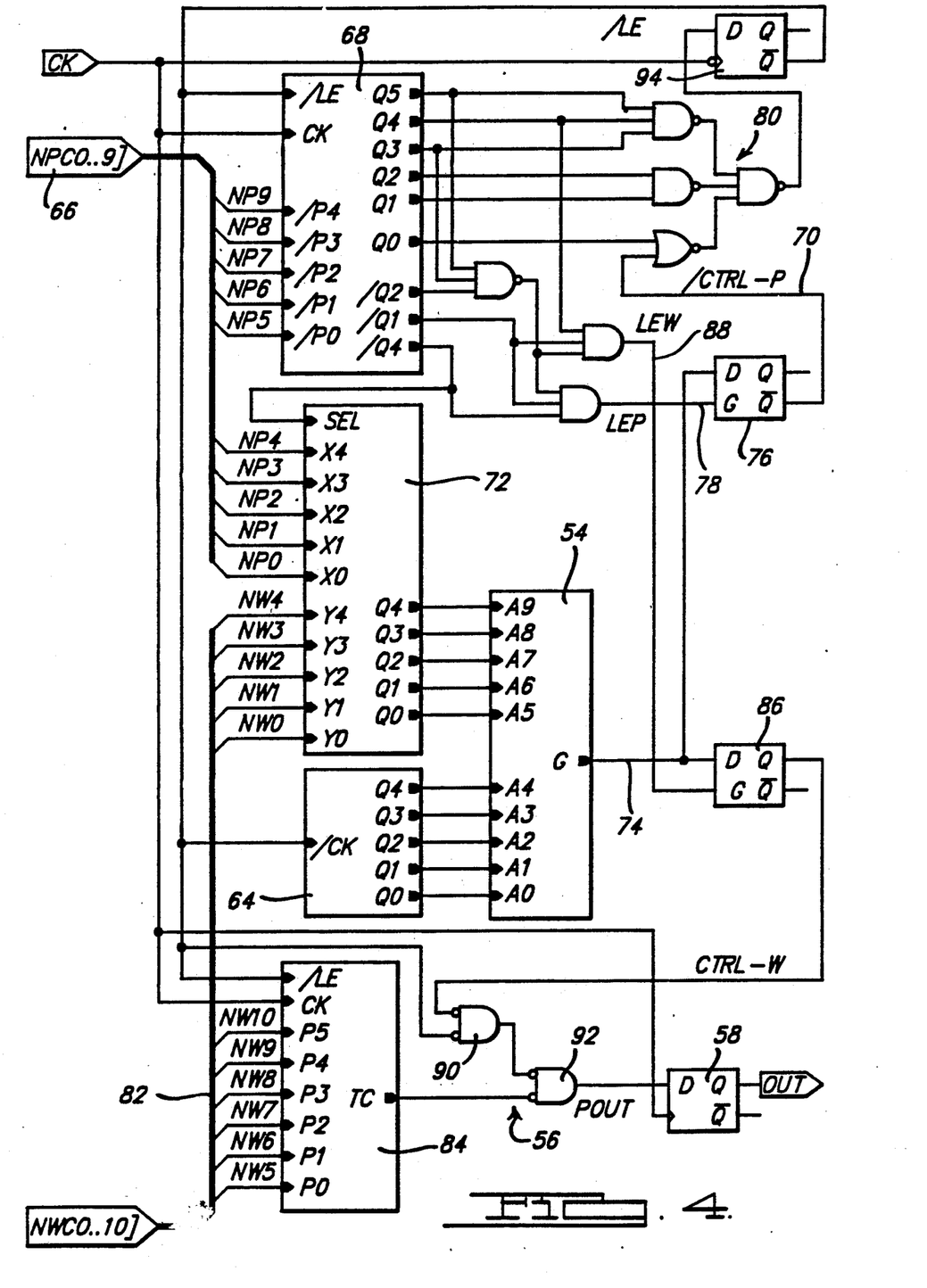
FIG. 4 is a detailed schematic diagram of the pulse generator circuit.

The presently preferred embodiment of waveform generator is adapted to convert a rational number $N_O = NW/NP$ into a pulse train. A detailed schematic of the waveform generator 26 is illustrated in FIG. 4. Where possible, components having functions similar to those of FIG. 3 have been given like reference numerals in FIG. 4. In general, the technique implemented by the invention may be applied to both integer and rational numbers. Irrational numbers can also be expressed by approximating them as rational numbers.

As previously described, in many sensor applications it is desirable to convert the sensor reading to a ratio of difference over sum. Where a complementary pair of sensors are used, this ratio can be expressed $(T_1 - T_2)/(T_1 + T_2)$, where $T_1$ and $T_2$ represent the respective readings of the first and second sensing elements. The numerator $(T_1 - T_2)$ is designated NW in FIG. 4. The denominator $(T_1 + T_2)$ is designated NP. As will be explained, the numerator NW controls the pulse width of the individual pulses of the generated pulse train, while the denominator NP determines the period of the pulse train. Both numerator and denominator are generated in the circuit of FIG. 4 using multiplexing techniques in order to share certain components.

A discussion of the circuit for generating denominator NP will be presented first. The digital denominator number NP is input on the first digital input bus 66 which comprises individual data lines NP0-NP9. The illustrated embodiment is a 10 bit system, however the invention is not limited to 10 bit systems and may be practiced using other resolutions by altering the size of the data path and associated components. Bus 66 divides the digital number NP into a most significant part (NP5-NP9) and a least significant part (NP0-NP4). The most significant part of NP is fed to counter 68. Counter 68 receives the system clock CK as well as a latch enable signal /LE. (As used herein, a slash (/) denotes the boolean "NOT" function.) In the present implementation the denominator NP is always expected to be between 1024 and 2047. Thus the most significant bit P5 of counter 68 may be permanently connected (not shown) to assume the binary 1 state.

Counter 68 is preset to the complement of the most significant part of NP when it receives the latch enable /LE signal. The counter counts up from the preset value to a terminal count which is variably determined by the logic circuitry associated with producing and interpreting the /CTRL-P signal on lead 70. Generation of this signal is discussed more fully below. When the state on lead 70 is binary 0, counter 68 counts up to a value of 62. When the state on lead 70 is a binary 1, counter 68 counts up to a value of 63. Modulation of the terminal count of counter 68 results in a selective widening of the period of the output pulse train. The period of the output pulse train corresponds to the denominator value NP.

The least significant bits of denominator NP are transmitted via bus 66 to a 5 bit multiplexer 72, which in turn routes the least significant portion to address lines A5-A9 of a read only memory (ROM) containing lookup table 54. The ROM lookup table 54 outputs either a binary 1 or 0 on output lead 74, depending on the stored value at that address. A table listing the presently preferred lookup table is given in the Appendix.

The output of lookup table ROM 54 is applied to the data input of latch 76 where that value is held until gated by the signal LEP on lead 78. The inverted output /Q of latch 76 provides the /CTRL-P signal. The signal LEP is generated by the logic gating network shown generally at 80.

Processing of the numerator NW is handled in a similar fashion. The numerator NW is applied to the second digital input bus 82, which splits into a most significant part (NW5-NW10) and a least significant part (NW0-NW4). The most significant part is applied to counter 84 as an initial preset value, which is read when the latch enable signal /LE is received. Counter 84 counts down from the preset value to a 0 terminal count. The least significant part (NW0-NW4) is applied to ROM lookup table 54 at addresses A0-A4 through the multiplexer 72. The /Q4 output of counter 68 is connected to multiplexer 72. The state of this output selects whether NP or NW is connected to ROM lookup table 54. The output of ROM lookup table 54 is also applied to the data terminal of latch 86 which is gated by the LEW signal on lead 88. The LEW signal is also generated by the logic gating network 80. The Q output of latch 86 provides the CTRL-W signal which selectively widens the pulse width of a selected pulse in the pulse train sequence. NAND gates 90 and 92 (comprising digital summing circuit 56) add the pulse widening signal CTRL-W with the output of counter 84 to drive the monostable circuit 58. Counter 84 provides an output TC which is low until the 0 terminal count is reached, whereupon the output TC goes high.

The resulting output pulse train waveform comprises a sequence of pulses in which the principal pulse width is dictated by the most significant part of numerator NW, with the pulse width of selected pulses being lengthened in accordance with the least significant part of numerator NW. The unique characteristics of the pulse train waveform generated by waveform generator 26 has profound implications upon the design of low pass filter 28. The pulse train waveform has far fewer non-DC harmonics than the output waveform of a conventional pulse width modulator. Because fewer harmonics are generated, the low pass filter, used to extract the DC component, can have a significantly higher cutoff frequency and thus a significantly faster response time.

Figure 5:
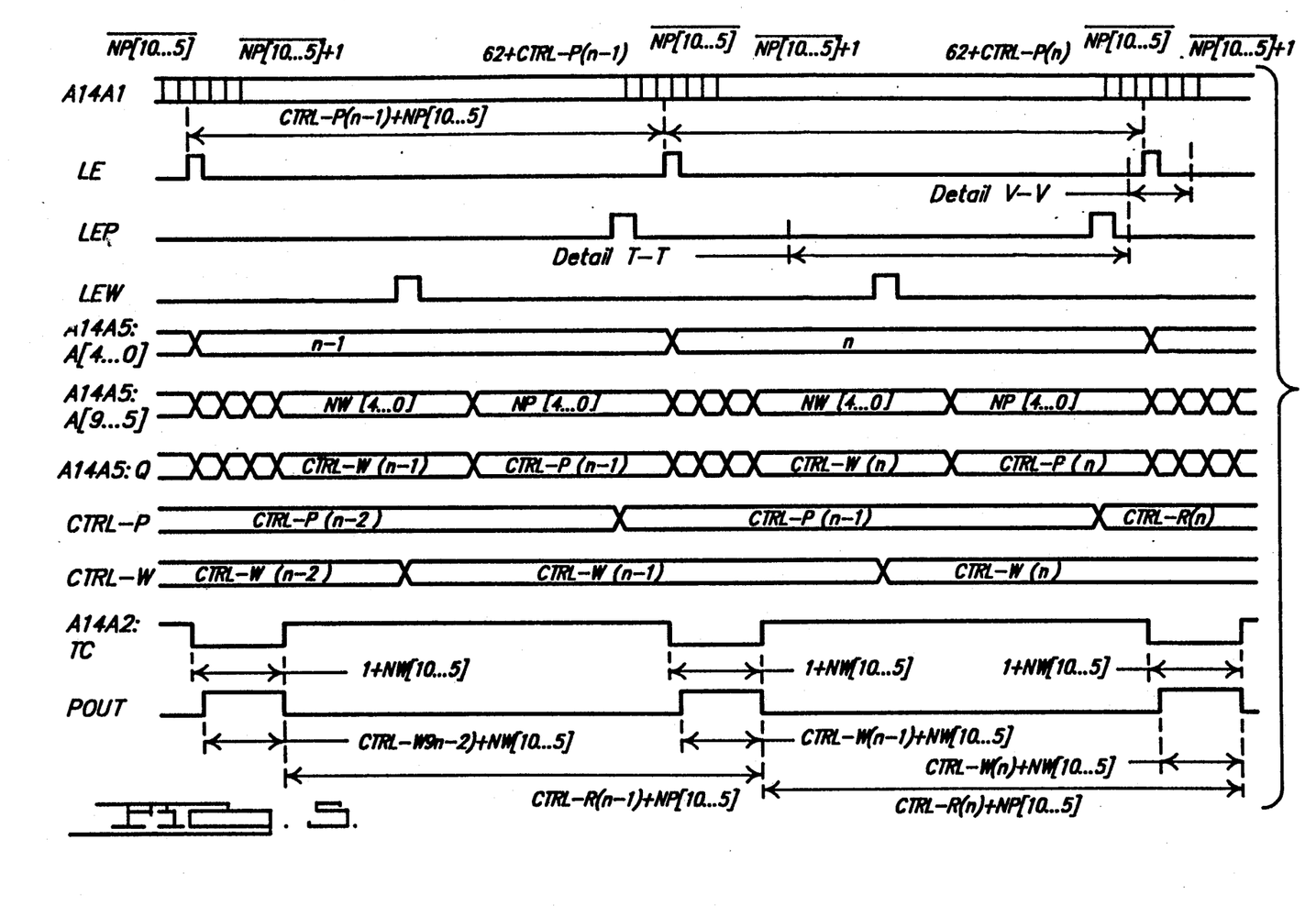
FIG. 5 is a timing diagram showing the time relationships among various signals within the circuit of FIG. 4.
Figure 7:
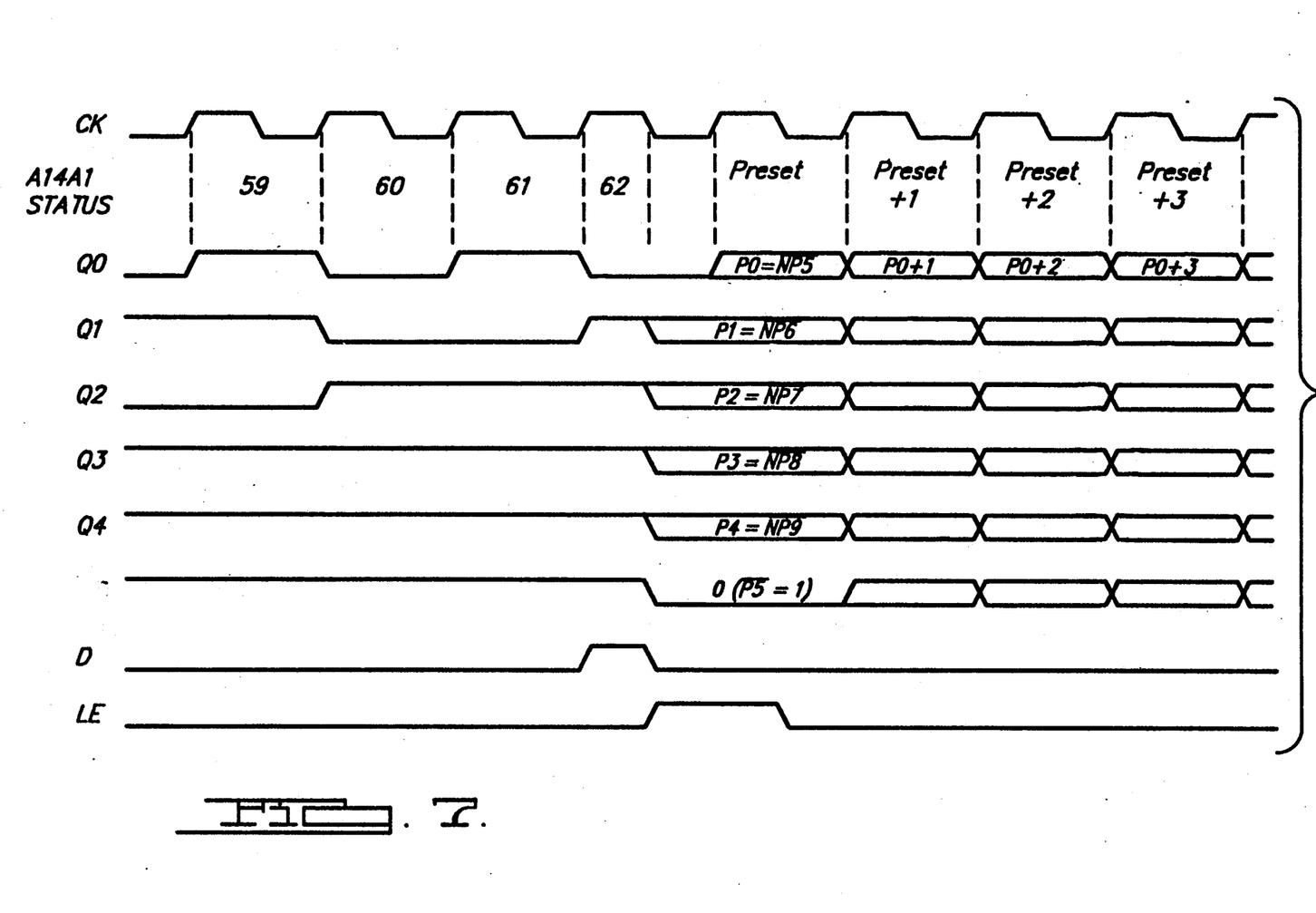

In order to understand the operation of the circuit of FIG. 4 more fully, refer to the timing diagrams of FIGS. 5-8. FIG. 5 is a timing diagram showing the time relationships among various signals within the circuit of FIG. 4. FIG. 6 is a detail of the diagram of FIG. 5 represented by the interval T—T of FIG. 5. FIGS. 7 and 8 correspond to the interval U—U of FIG. 5, FIG. 7 being the case where CTRL−P=0 and FIG. 8 being the case where CTRL−P=1.

Specifically, FIG. 5 shows the relationship of the states of counters 68 and 84, lookup table ROM 54, timing signals LE, LEP, LEW, CTRL-P and CTRL-W. In addition, FIG. 5 also shows the output POUT of monostable 58, which produces the output pulse train of the waveform generator 26. In the timing diagrams of FIG. 5 the lower case n represents the status of counter 64. Similarly, FIG. 6 gives the timing states of counter 68, lookup table ROM 54 as well as control signals LEP, LEW, CTRL-P and CTRL-W, all for the time interval designated T—T on FIG. 5.

FIGS. 7 and 8 specifically show the states of the Q0-Q5 outputs of counter 68 in relation to the system clock CK, the D input of latch 94 and the latch enable signal LE. When CTRL−P=0, the count sequence of counter 68 begins with the preset value read at /P0 through /P4 and proceeds as follows: Preset, Preset +1, Preset +2, . . . 60, 61, 62. In this case the total number of states equals the repetition period which is 63 minus the Preset value. This, in turn, is equal to Preset=NP[10 . . . 5], where NP10=1.

For the case where CTRL−P=1, the count sequence of counter 68 is as follows: Preset, Preset+1, Preset+2, . . . 60, 61, 62, 63. The total number of states equals the repetition period, which in this case, is 64 minus the Preset value. This is in turn equal to 1+(63 − Preset), equals 1+/Preset=1+NP[10 . . . 5], where NP10=1.

Figure 9:
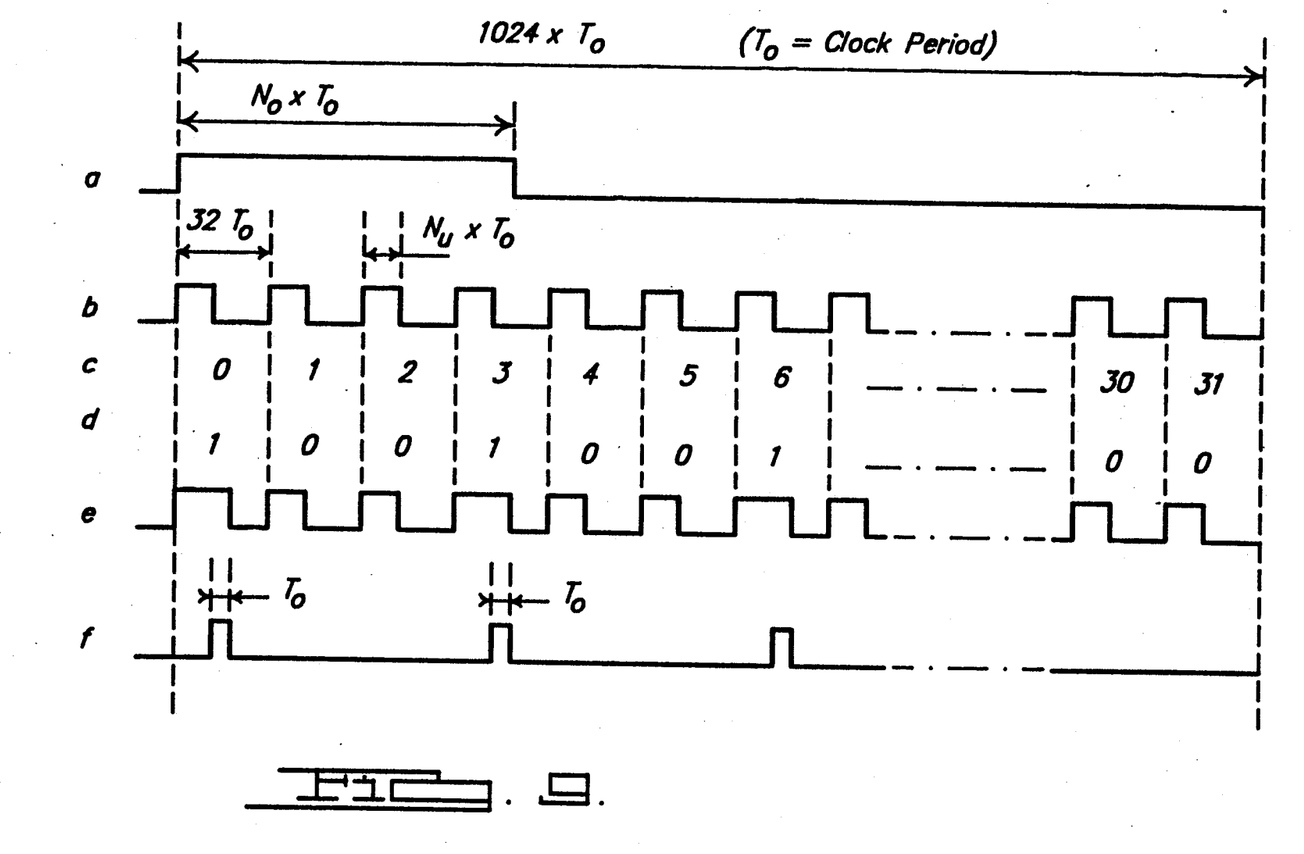
FIG. 9 comprises a series of timing diagrams useful in understanding the operation of the invention.

Referring now to FIG. 9, a comparison will be made between the output of a conventional pulse width modulator and the waveform generator of the invention. Specifically, FIG. 9 comprises a timing diagram comprising lines designated A through F. In this case, a 10 bit resolution is assumed for both conventional pulse width modulator and the invention waveform generator. In FIG. 9, $T_0$ is used to denote the clock period and $f_{clk}$ to denote the clock frequency ($1/T_0$). $N_O$ denotes the digital output from the computing unit 20. For a 10 bit system $N_O$ can be any value from 0 to 1023. $N_u$ denotes the most significant part of $N_O$ and $N_l$ denotes the least significant part of $N_O$. For a 10 bit system, assuming the digital output number $N_O$ is split into equal parts of 5 bits each, $N_u$ and $N_l$ can be any value between 0 and 31. For simplicity, $N_O$ is in this example assumed to be an integer number. As explained above, the invention can be practiced upon rational numbers and also upon irrational numbers by approximation. In general, the benefits of the invention as applied to integer numbers are equally applicable to rational numbers and approximated irrational numbers.

In FIG. 9, line A illustrates how a conventional pulse width modulator would convert a digital number $N_O$ into a pulse train. As illustrated, the pulse width of the pulse train of line A is a direct product of the integer number $N_O$ and the clock period. The pulse train comprises only a single ON/OFF cycle over the time interval illustrated. The time interval illustrated is the resolution number 1024 multiplied by the clock period $T_0$.

Lines B through F illustrate various aspects of the inventive waveform generator. In line B the output pulse train is illustrated, as it would appear if only the most significant part of $N_O$ is considered. In this instance, the pulse train comprises a sequence of ON/OFF cycles, 32 in number. There are 32 in number, because it has been assumed that the 10 bit number $N_O$ has been divided into equal 5 bit halves, each half being capable of representing a number in the range of 0-31. Since only the most significant part is considered on line B, all ON/OFF cycles are of identical pulse width for the entire sequence of 32 pulses.

The actual output waveform of the waveform generator of the invention is depicted on line E. Line E takes into account both the most significant and the least significant parts of $N_O$. Although some of the individual ON/OFF pulse widths remain unchanged from that of line B, others are lengthened by one clock period. Line C shows the state of counter 64 (which applies the lowermost address values A0-A4 to lookup table ROM 54). Line D gives the output of lookup table ROM 54 for the case where the least significant part $N_l$=10. Line F gives the difference waveform between lines E and B. It is seen that the pulses which occur when line D is high are lengthened by one clock period $T_0$. The lookup table is used to evenly distribute or spread out the pulse lengthening events over the entire sequence in order to minimize the high frequency spectral components as much as possible. This has advantages in improving filter response time and thus system response time.

Figure 10:
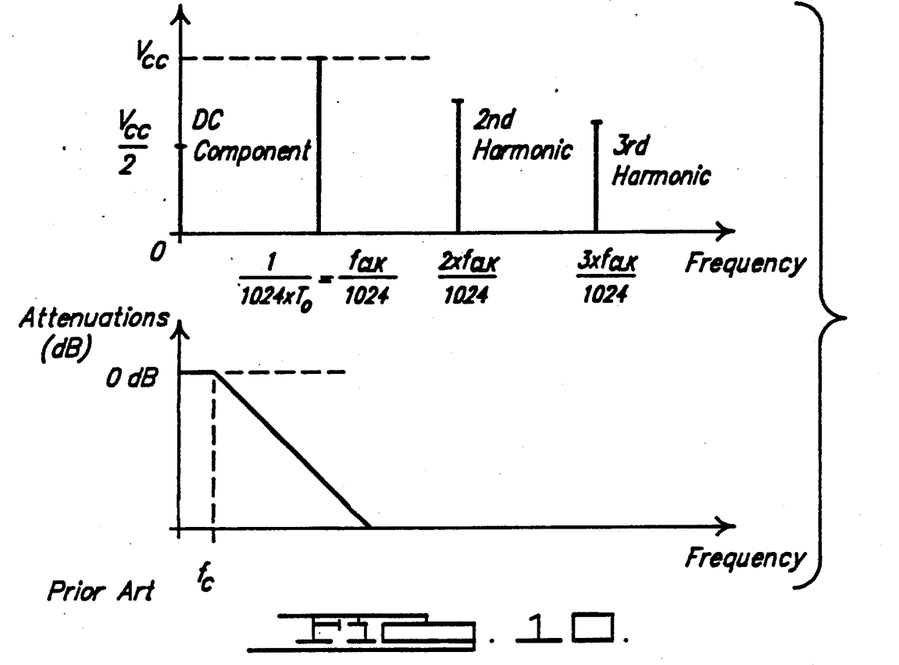
FIG. 10 is a frequency spectrum diagram illustrating the frequency spectrum and filter characteristics of a prior art pulse width modulated system.
Figure 11:
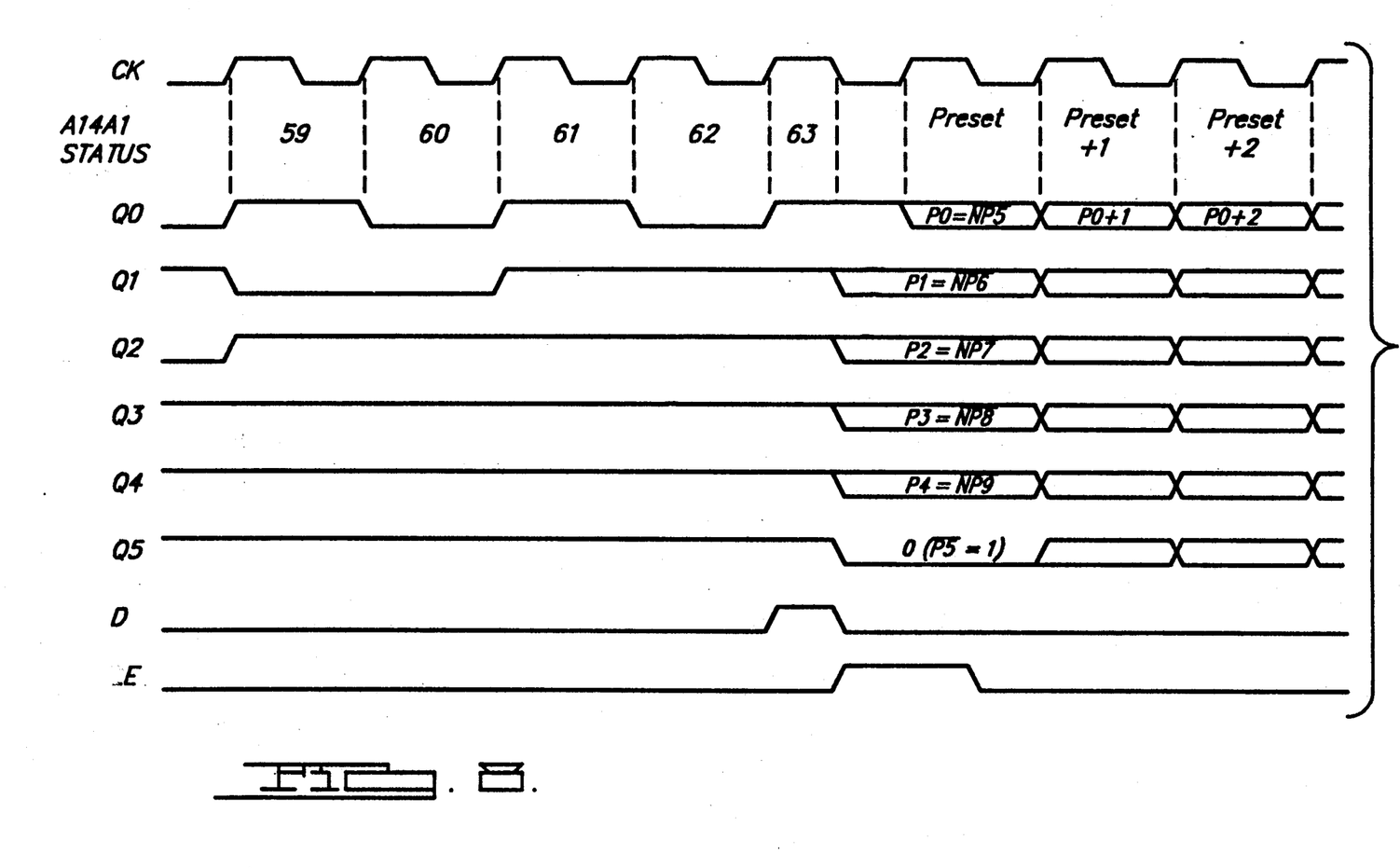
FIG. 11 is a frequency spectrum diagram illustrating the spectrum and filter characteristics when using the invention.

To gain a better understanding of how the invention improves system response time, FIGS. 10 and 11 compare the spectral content of typical output waveforms of the conventional pulse width modulator (FIG. 10) and of the waveform generator of the invention (FIG. 1). In both instances, it is assumed that the low pass filter, e.g., low pass filter 28, is a two-pole filter for which the output is attenuated 12dB per octave past the cutoff frequency $f_c$. In FIGS. 10 and 11, the DC component as well as the first, second and third harmonics of the representative output waveform are illustrated. These spectra will vary, depending on the value of the digital number $N_O$.

The purpose of the low pass filter is to extract the DC component by attenuating the higher order harmonics to at least 50% of the value for the least significant bit represented by the system. In practice, in order to accurately resolve the least significant bit, harmonics above the DC component should be attenuated by a factor greater than 2048 (for a 10 bit system).

slope of the 12dB per octave dropoff of the respective figures.

Because the low pass filter may have a much higher cutoff frequency when using the waveform generator of the invention, a much faster system response time results. Moreover, the higher cutoff frequency dictates smaller filter components, making the system well-suited for automotive and other mass production applications.

While the invention has been shown and described in connection with the presently preferred embodiments, the invention is capable of certain modifications without departing from the spirit of the invention as set forth in the appended claims.

APPENDIX

| A[9..5] (hex) | A[4..0] (hex) 00 | | | . . . . 0F | | | | . . . . 1F |
|---|---|---|---|---|---|---|---|---|
| 00 | 0000 | 0000 | 0000 | 0000 | 0000 | 0000 | 0000 | 0000 |
| 01 | 0000 | 0000 | 0000 | 0000 | 0000 | 0000 | 0000 | 0001 |
| 02 | 0000 | 0000 | 0000 | 0001 | 0000 | 0000 | 0000 | 0001 |
| 03 | 0000 | 0000 | 0100 | 0000 | 0000 | 1000 | 0000 | 0001 |
| 04 | 0000 | 0001 | 0000 | 0001 | 0000 | 0001 | 0000 | 0001 |
| 05 | 0000 | 0100 | 0001 | 0000 | 0010 | 0000 | 1000 | 0001 |
| 06 | 0000 | 1000 | 0100 | 0001 | 0000 | 1000 | 0100 | 0001 |
| 07 | 0001 | 0000 | 1000 | 1000 | 0100 | 0100 | 0010 | 0001 |
| 08 | 0001 | 0001 | 0001 | 0001 | 0001 | 0001 | 0001 | 0001 |
| 09 | 0010 | 0010 | 0100 | 0100 | 1000 | 1001 | 0001 | 0001 |
| 0A | 0010 | 0100 | 1001 | 0001 | 0010 | 0100 | 1001 | 0001 |
| 0B | 0100 | 1001 | 0010 | 0100 | 1001 | 0010 | 0100 | 1001 |
| 0C | 0100 | 1001 | 0100 | 1001 | 0100 | 1001 | 0100 | 1001 |
| 0D | 0101 | 0010 | 1001 | 0100 | 1010 | 0101 | 0010 | 1001 |
| 0E | 0101 | 0100 | 1010 | 1001 | 0101 | 0100 | 1010 | 1001 |
| 0F | 0101 | 0101 | 0101 | 0100 | 1010 | 1010 | 1010 | 1001 |
| 10 | 0101 | 0101 | 0101 | 0101 | 0101 | 0101 | 0101 | 0101 |
| 11 | 1010 | 1010 | 1010 | 1011 | 0101 | 0101 | 0101 | 0101 |
| 12 | 1010 | 1011 | 0101 | 0101 | 1010 | 1011 | 0101 | 0101 |
| 13 | 1010 | 1101 | 0110 | 1011 | 0101 | 1010 | 1101 | 0101 |
| 14 | 1011 | 0101 | 1011 | 0101 | 1011 | 0101 | 1011 | 0101 |
| 15 | 1011 | 0110 | 1101 | 1011 | 0110 | 1101 | 1011 | 0101 |
| 16 | 1101 | 1011 | 0110 | 1101 | 1101 | 1011 | 0110 | 1101 |
| 17 | 1101 | 1101 | 1011 | 1011 | 0111 | 0110 | 1110 | 1101 |
| 18 | 1101 | 1101 | 1101 | 1101 | 1101 | 1101 | 1101 | 1101 |
| 19 | 1110 | 1111 | 0111 | 0111 | 1011 | 1011 | 1101 | 1101 |
| 1A | 1111 | 0111 | 1011 | 1101 | 1111 | 0111 | 1011 | 1101 |
| 1B | 1111 | 1111 | 1110 | 1111 | 1101 | 1111 | 0111 | 1101 |
| 1C | 1111 | 1101 | 1111 | 1101 | 1111 | 1101 | 1111 | 1101 |
| 1D | 1111 | 1111 | 1011 | 1111 | 1111 | 0111 | 1111 | 1101 |
| 1E | 1111 | 1111 | 1111 | 1101 | 1111 | 1111 | 1111 | 1101 |
| 1F | 1111 | 1111 | 1111 | 1111 | 1111 | 1111 | 1111 | 1101 |

Total: 528 locations "ZERO"
496 locations "ONE"

In comparing FIGS. 10 and 11, note that a substantial portion of the high frequency energy of the pulse train of FIG. 11 occurs at the spectrum of the most significant part (line B of FIG. 5). The spectrum of the most significant part is $f_{clk}/32$ in this example. The spectra associated with the least significant part are considerably lower in energy, as illustrated in FIG. 11. In contrast, a conventional pulse width modulation approach produces very substantial energy levels in the first, second and third harmonics, specific levels being dictated by the value of $N_O$. In order to filter out these higher order harmonics, the filter appropriate for the pulse train of FIG. 10 has a cutoff frequency $f_c$ which is substantially lower than the corresponding cutoff frequency of the filter appropriate for the pulse train of FIG. 11. In FIGS. 10 and 11 frequency is plotted along the horizontal axis using a linear scale rather than a logarithmic scale. This accounts for the difference in

What is claimed is:

1. A method of representing an integer number $N_O$ as a variable duty cycle pulse train of predetermined repetition rate comprising:
   dividing said integer number $N_O$ into a most significant part and a least significant part;
   representing the most significant part as a sequence of a predetermined number of pulses wherein the duty cycle of each pulse represents a value corresponding to said most significant part;
   representing the least significant part by selectively altering the duty cycle of selected ones of said pulses, said selected ones of said pulses being predetermined by consulting a lookup table;
   wherein the sequence of pulses so altered, when integrated over the sequence, represents said integer number $N_O$.

2. The method of claim 1 further comprising integrating the sequence of pulses so altered to produce a representation of said integer number $N_O$.

3. The method of claim 1 further comprising low pass filtering the sequence of pulses so altered to produce a DC component representing said integer number $N_O$.

4. The method of claim 1 wherein said most significant part and said least significant part each comprise predetermined numbers of digits.

5. A method of representing an integer number $N_O$ as a variable duty cycle pulse train of predetermined repetition rate comprising:
dividing said integer number $N_O$ into a most significant part and a least significant part;
representing the most significant part as a sequence of a predetermined number of pulses wherein the duty cycle of each pulse represents a value corresponding to said most significant part;
representing the least significant part by selectively altering the duty cycle of selected ones of said pulses;
wherein the sequence of pulses so altered, when integrated over the sequence, represents said integer number $N_O$;
further comprising defining a sequence by selecting a number of said pulses equal to the maximum number capable of being represented by the digits of said least significant part.

6. The method of claim 5 further comprising selectively altering the duty cycle of a number of pulses within said sequence where the duty cycle of the altered pulses represents the least significant part.

7. A method of representing a rational number [NW/NP] comprising numerator NW and denominator NP as a variable duty cycle pulse train of predetermined repetition rate comprising:
dividing said numerator NW into a most significant part and a least significant part, each part comprising first and second predetermined numbers of digits, respectively;
dividing said denominator NP into a most significant part and a least significant part, each part comprising third and fourth predetermined numbers of digits, respectively and wherein said fourth predetermined number equals said second predetermined number;
representing the most significant part of said numerator NW as a first sequence of a predetermined number of pulses wherein the duty cycle of each pulse represents a value corresponding to said most significant part;
representing the most significant part of said denominator NP as a second sequence of a predetermeined number of pulses wherein the duty cycle of each pulse represents a value corresponding to said most significant part;
representing the least most significant part of said numerator NW by selectively altering the duty cycle of selected ones of said pulses of said first sequence;
representing the least significant part of said denominator NP by selectively altering the duty cycle of selected ones of said pulses of widths of pulses in the said second sequence;
combining said first and second sequences to define a train of pulses of width corresponding to said first sequence and of period corresponding to said second sequence;
wherein said train of pulses when integrated represents said rational number [NW/NP].

8. The method of claim 7 wherein the most significant part of the numerator and denominator have the same number of digits.

9. The method of claim 7 wherein the least significant part of the numerator and denominator have the same number of digits.

10. The method of claim 7 further comprising representing the least significant part of denominator NP as a repetitive sequence of said pulses with period determined by the most significant part of denominator NP, wherein the number of pulses of said sequence is equal to the maximum value of the least significant part of denominator NP, and wherein the periods of individual pulses within said sequence is selectively altered as determined by the particular value of the least significant part of denominator NP.

11. The method of claim 7 further comprising representing the most significant part of the numerator NW as a second repetitive sequence of pulses wherein the periods of said pulses is equal to the periods of the first sequence of pulses, and wherein the width of pulses represents a value corresponding to said most significant part of numerator NW.

12. The method of claim 1 further comprising defining a sequence by selecting a number of said pulses equal to the maximum number capable of being represented by the digits of said least significant part.

13. The method of claim 12 further comprising selectively altering the duty cycle of a number of pulses within said sequence where the duty cycle of the altered pulses represents the least significant part.

14. The method of claim 5 further comprising integrating the sequence of pulses so altered to produce a representation of said integer number $N_O$.

15. The method of claim 5 further comprising low pass filtering the sequence of pulses so altered to produce a DC component representing said integer number $N_O$.

16. The method of claim 5 wherein said most significant part and said least significant part each comprise a predetermined numbers of digits.

* * * * *

UNITED STATES PATENT AND TRADEMARK OFFICE
CERTIFICATE OF CORRECTION

PATENT NO. : 5,053,769
DATED : October 1, 1991
INVENTOR(S) : Wolf S. Landmann

It is certified that error appears in the above-indentified patent and that said Letters Patent is hereby corrected as shown below:

Column 3, line 68, delete "Which" and insert -- which --.

Column 7, line 62, before "Preset" insert -- \ --.

Column 11, line 53, Claim 7, delete "predetermeined" and insert -- predetermined --.

Column 12, line 54, Claim 16, delete "a".

Signed and Sealed this

Eleventh Day of January, 1994

Attest:

BRUCE LEHMAN

Attesting Officer

Commissioner of Patents and Trademarks